United States Patent [19]

Larson et al.

[11] Patent Number: 5,414,382
[45] Date of Patent: May 9, 1995

[54] IMPEDANCE BUFFER FOR DRIVING CAPACITIVE LOADS

[75] Inventors: Tony R. Larson; Raymond S. Taylor, both of Tucson, Ariz.

[73] Assignee: International Business Machines Corporation, Armonk, N.Y.

[21] Appl. No.: 130,058

[22] Filed: Sep. 30, 1993

[51] Int. Cl.⁶ .............................................. G06G 7/12
[52] U.S. Cl. .................................. 327/561; 327/563; 327/427
[58] Field of Search ............... 307/494, 496, 497, 353; 330/252, 253, 255, 260

[56] References Cited

U.S. PATENT DOCUMENTS

| | | | |
|---|---|---|---|
| 4,389,579 | 6/1983 | Stein | 307/353 |
| 4,542,305 | 9/1985 | Blauschild | 307/353 |
| 5,172,016 | 12/1992 | Dobberpuhl | 307/497 |

OTHER PUBLICATIONS

Chu Phoon Chong, Kenneth C. Smith, Zvonko G. Vranesic, *Using Active Components to Perform Voltage Division in Digital-to-Analog Conversion*, IEEE Journal of Solid-State Circuits, vol. 24, No. 4, Aug. 1989, pp. 999–1002.

*Microelectronics: Digital and Analog Circuits and Systems*, Peter D. Nalle, et al. Eds., pp. 596–598, McGraw-Hill, Inc., 1979.

*Primary Examiner*—William L. Sikes
*Assistant Examiner*—James A. Dudek
*Attorney, Agent, or Firm*—Baker, Maxham, Jester & Meador

[57] ABSTRACT

An impedance buffer circuit suitable for monolithic implementation as a capacitive load driver such as required in sample-and-hold circuit applications. This impedance buffer circuit provides the speed of the emitter-follower amplifier and the accuracy of the differential amplifier without the normal output offset, excessive overshoot and ringing or slew rate limitations. An emitter-follower amplifier element is coupled to operate in parallel with a differential amplifier element, which may be optimized for performance over the final 0.7 volt ($V_{be}$) portion at each end of the output voltage range.

27 Claims, 4 Drawing Sheets

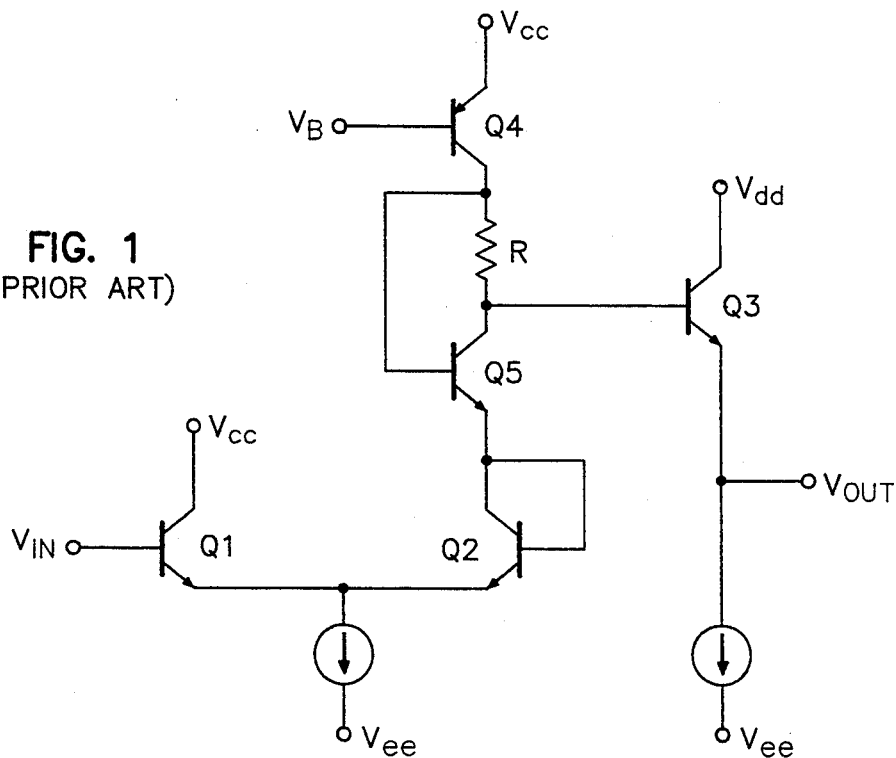
FIG. 1
(PRIOR ART)
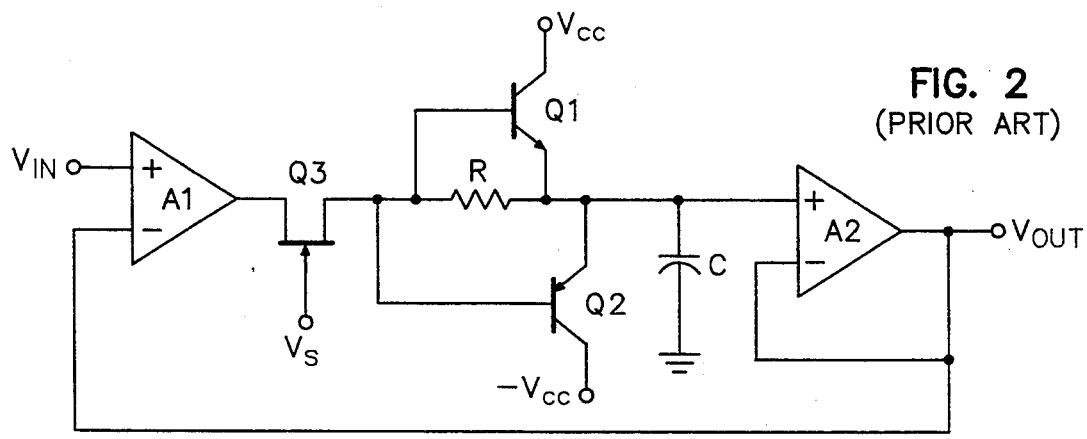
FIG. 2
(PRIOR ART)
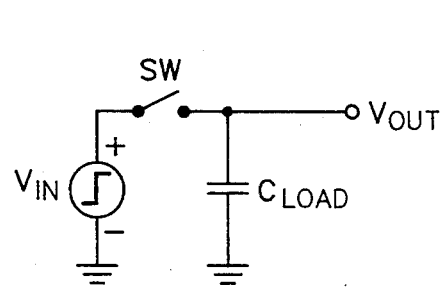
FIG. 3A
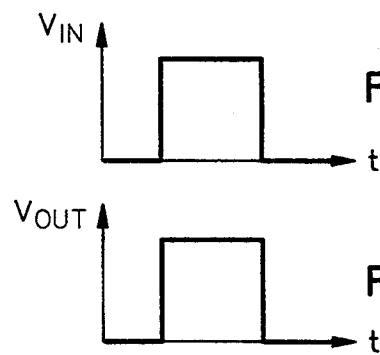
FIG. 3B
FIG. 3C

IMPEDANCE BUFFER FOR DRIVING CAPACITIVE LOADS

BACKGROUND OF THE INVENTION

1. Field of the Invention

This invention relates generally to impedance buffers for isolating a low-current source from high-current loads and, more specifically, to an impedance buffer circuit suited for accurate monolithic sample-and-hold device applications.

2. Description of the Related Art

A typical data-acquisition system receives signals from a number of different sources and transmits these signals in suitable form to a communication channel or computer. A multiplexer selects each signal in sequence and the analog information is then converted into a constant sample voltage over a gating-time interval by means of a sample-and-hold system. The constant output of the sample-and-hold system may then be converted to a digital signal, using analog-to-digital converter techniques, for digital transmission. A sample-and-hold circuit in its simplest form is merely a switch in series with a charge storage device such as capacitor (FIG. 3A). The switch is closed during the sample interval to permit the analog signal voltage to charge the capacitor, which then retains the charge necessary to provide a constant sample-voltage output signal.

In such a sample-and-hold circuit, as in many other circuits, it is necessary to quickly drive the capacitive load to the desired voltage. Ideally, a perfect step voltage source (e.g.: FIG. 3B) would drive a capacitor (e.g.: $C_{LOAD}$ in FIG. 3A) to its fully-charged state instantaneously (such as illustrated in FIG. 3C). In the real world, perfect step voltage sources do not exist. Every real voltage source exhibits finite output impedance, slew rate limits and other sources of error. When a signal supplied from a first driving circuit is insufficient to meet the demands of a second loading circuit, the performance of both is degraded.

Practitioners in the art have introduced several solutions to this problem over the years. Two popular circuits for driving capacitive loads are the emitter-follower amplifier and the differential amplifier. Each of these well-known circuits operates as an impedance buffer placed between the output of a first driving circuit and the input of a second loading circuit. The impedance buffer has a high input impedance that draws little current from the first driving circuit and a low output impedance that supplies a high current to the second loading circuit without affecting first driving circuit performance. Also, an impedance buffer may act as a voltage follower that introduces predetermined changes to the voltage level of the signal transmitted between the circuits.

FIG. 4A shows a simple emitter-follower amplifier well-known in the art for driving capacitive loads. Emitter-follower amplifiers are extremely fast because they offer low output impedance and high output current capacity. Emitter followers are simple in design and implementation and relatively inexpensive. Such amplifiers possess a fixed voltage gain of nearly unity, making them attractive candidates for driving capacitive loads.

However, the emitter-follower amplifier also has significant disadvantages. The output voltage waveform in FIG. 4C exhibits the inherent voltage offset from the input voltage (compare FIG. 4B). Also, the single-ended emitter follower shown in FIG. 4A does not drive the load equally in both rising and falling directions. The NPN Bipolar Junction Transistor (BJT) Q1 shown in FIG. 4A drives the output voltage $V_{OUT}$ upward rapidly but does not bring it down as quickly. The circuit may drive the load faster upwards or downwards, depending on whether NPN or PNP BJTs are used.

FIG. 5C shows this characteristic for the dual NPN BJT emitter-follower amplifier of FIG. 5A driven by the square wave input of FIG. 5B. FIG. 5C shows that the voltage on capacitor $C_{LOAD}$ quickly follows the rising edge of the input signal with the characteristic offset, but is slew rate limited on the following edge because of the limited bias current $I_{BIAS}$. This slew rate problem can be reduced by increasing the $V_{bias}$ on transistor Q2 to increase the bias current level but this results in higher power dissipation.

FIG. 6A shows a complementary NPN-PNP BJT emitter-follower configuration, which is a solution to the slew rate problem alternative to increasing the bias current. In FIG. 6A, the PNP BJT Q2 is added in series with the NPN BJT Q1 from FIG. 4A. However, as seen in FIG. 6C, this solution introduces a second voltage offset to the falling edge signal, further distorting the initial input signal of FIG. 6B. Even so, the circuit of FIG. 6A is favored in the art. For instance, Jacob Millman (*Microelectronics: Digital and Analog Circuits and Systems*, "Sample-and-Hold Systems", pp 596–599, McGraw-Hill, Inc., New York, 1979) discusses the improved sample-and-hold configuration shown in FIG. 2 herein. The transistors Q1 and Q2 form an external complementary emitter-follower circuit between the sampling switch Q3 and the storage capacitor C to increase the current available for charging capacitor C.

The differential amplifier is also a well-known method for driving capacitive loads. FIG. 7A shows a typical differential amplifier used in the art for driving capacitive loads. The differential amplifier avoids the voltage offset problems seen in FIGS. 4C, 5C and 6C for typical emitter-follower amplifier circuits. The differential amplifier also reduces other nonlinearities by employing negative feedback. However, the differential amplifier exhibits the additional undesirable characteristics of slew rate limiting, overshoot, ripple and timing delays. These problems are characteristic of any feedback amplifier system with negative feedback such as the differential amplifier and are illustrated in the output waveform shown in FIG. 7C.

Although step inputs (FIG. 7B) to capacitive loads generally result in overshoot and ringing or ramping at too-slow slew rates, proper amplifier design can optimize the output voltage response (FIG. 7C) for selected applications. For instance, in U.S. Pat. No. 4,389,579, Marc T. Stein discloses a sample-and-hold circuit employing a cascoded amplifier coupled to the capacitive load for charging and discharging the capacitor. Also, in U.S. Pat. No. 4,542,305, Robert A. Blauschild discloses the impedance buffer shown in FIG. 1, which is based on a differential amplifier configuration. Blauschild includes a resistor coupled between the base and collector of an intermediate transistor to reduce output settling time. Note that Blauschild combines a differential amplifier consisting of transistors Q1 and Q2 with an emitter-follower amplifier that uses transistor Q3 at the output. However, Blauschild neither teaches nor considers use of an emitter-follow amplifier in parallel with his differential amplifier. In fact, useful application of such a parallel combination of amplifiers is heretofore unknown in the art.

There is a clearly-felt need in the art to provide effective impedance buffering between driving circuits having limited current driving capacity and driven circuits having very low impedance, such as an uncharged load capacitor. The related unresolved problems and deficiencies are clearly felt in the art and are solved by this invention in the manner described below.

SUMMARY OF THE INVENTION

The circuit of this invention solves the above problems by combining the best properties of the emitter-follower amplifier and the differential amplifier. These two amplifiers are coupled in parallel to form the impedance buffer of this invention. An emitter-follower amplifier element provides the high charging currents necessary during the early capacitor-charging portion of an input cycle. A differential amplifier element provides the final zero-offset capacitor voltage control necessary for accurate output voltage levels during the final fraction of a volt of the capacitor-charging cycle.

It is an object of this invention to provide impedance buffering suitable for use in sample-and-hold circuits for driving capacitive loads without voltage offsets and slew rate limitations. It is an advantage of the circuit of this invention that the differential amplifier element design can be optimized for operation over a very small operating voltage range to minimize slew rate requirements, overshoot and ringing because the emitter-follower amplifier element quickly handles the remaining portion of the operating voltage range.

It is another advantage of the method of this invention that it is suited for implementation in a three-input differential embodiment as well as a two-input differential embodiment.

The foregoing, together with other objects, features and advantages of this invention, will become more apparent when referring to the following specification, claims and the accompanying drawing.

BRIEF DESCRIPTION OF THE DRAWING

For a more complete understanding of this invention, reference is now made to the following detailed description of the embodiments as illustrated in the accompanying drawing, wherein:

FIG. 1 shows an impedance buffer circuit from the prior art;

FIG. 2 shows an improved sample-and-hold circuit from the prior art;

FIGS. 3A–3C illustrate a basic impulse-charged capacitor circuit with input and output voltage waveforms from the prior art;

DESCRIPTION OF THE PREFERRED EMBODIMENTS

The impedance buffer circuit of this invention can be summarily described as a combination of the best features of both the differential amplifier circuit and the emitter-follower amplifier circuit. These results are obtained by connecting a differential amplifier 20 in parallel with an emitter-follower amplifier 22 as exemplified by the impedance buffer circuit in FIG. 8A. Differential amplifier 20 includes the four BJTs Q1–Q4. Transistors Q1–Q4 are connected in the customary differential amplifier configuration and are biased with a direct current supply voltage $V_{dd}$ and a biasing current $I_{BIAS}$.

Emitter-follower amplifier 22, consisting of BJT Q5, is connected in parallel with differential amplifier 20. That is, the base of Q5 is connected to the input voltage $V_{IN}$ to differential amplifier 20 and the emitter of Q5 is coupled directly to the output voltage $V_{OUT}$ of differential amplifier 20. This configuration is neither taught nor suggested in the existing art for application as an impedance buffer for capacitive loads. The reasons for this absence are straightforward: both the differential amplifier and the emitter-follower amplifier are known to provide practically the same function in analog circuits. Thus, the existing art teaches away from connecting both in parallel as such a connection heretofore was considered to be disadvantageously redundant.

The impedance buffer circuit design of this invention arose from the unexpectedly advantageous observation that connecting an emitter-follower amplifier circuit in parallel with a differential amplifier circuit permits the differential amplifier design to be optimized for the last few hundred millivolts of the output voltage $V_{OUT}$ operating region, thereby eliminating the design compromises normally responsible for slew rate limiting and ringing in differential amplifier designs.

Figure 8A:
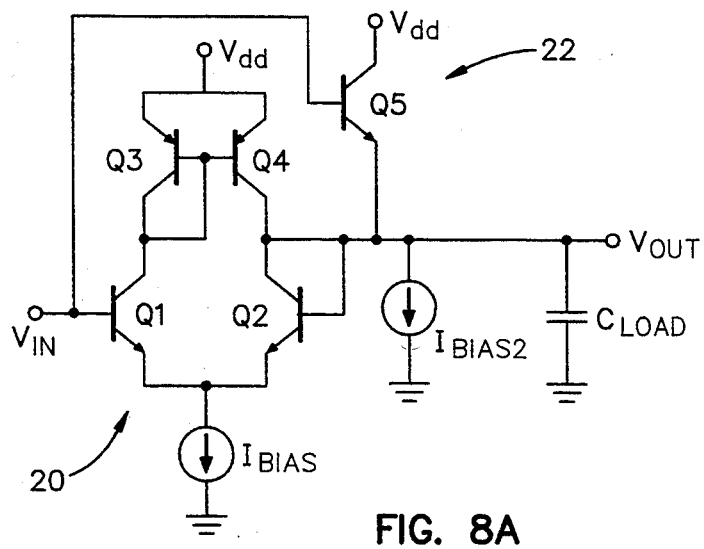
FIGS. 8A–8C show an exemplary embodiment of the impedance buffer circuit of this invention with associated input and output waveforms.
Figure 8B:
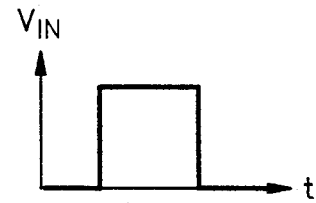
Figure 8C:
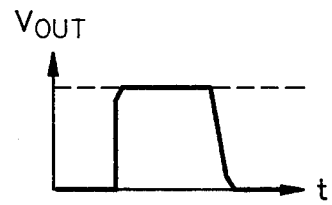

In FIG. 8A, when the step input signal (FIG. 8B) is applied as $V_{IN}$ to the circuit, the faster emitter-follower amplifier 22 quickly charges the capacitive load $C_{LOAD}$ to within one base-emitter voltage drop ($V_{be}$) of the desired output level (FIG. 8C). Differential amplifier 20, while operational during this interval, does not significantly affect the system response until the output voltage $V_{OUT}$ approaches one base-emitter voltage drop (about 0.7 volts) of the desired output level. At that point, differential amplifier 20 then dominates the response and continues driving capacitor $C_{LOAD}$ until $V_{OUT}$ reaches the ideal value. During this last few hundred millivolts of output voltage swing, the emitter current through BJT Q5 is forced to zero by the insufficient base-emitter bias voltage, thereby disabling emitter-follower amplifier 22.

If differential amplifier 20 is optimized for operation over the small 700 mv voltage region below from 100% $V_{OUT}$, then the necessary slew rate is much smaller than normal, thereby minimizing overshoot and ringing problems in $V_{OUT}$ (See FIG. 8C) arising from a high slew rate design. If the impedance buffer in FIG. 8A relies entirely on differential amplifier 20, then differential amplifier 20 must be provided with much higher slew rate to permit it to operate over a much wider range of input voltage, thereby introducing the output voltage problems noted, for instance, in FIG. 7C.

Figure 4A:
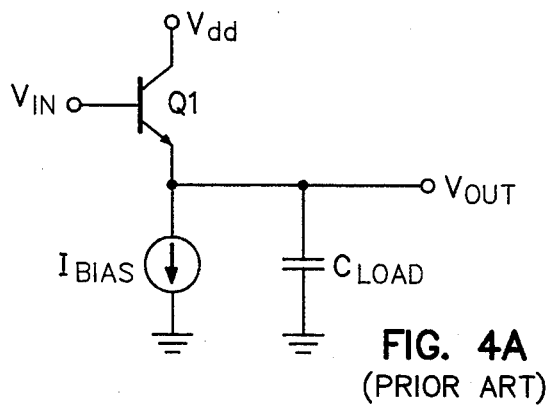
FIGS. 4A–4C show a simple emitter-follower amplifier capacitor-charging circuit with input and output voltage waveforms from the prior art.
Figure 4B:
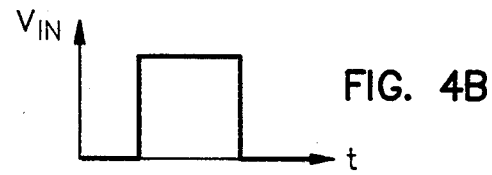
Figure 4C:
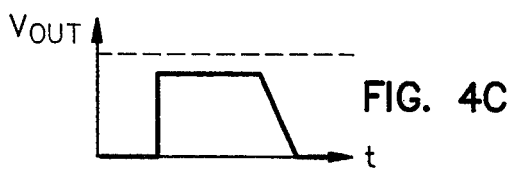
Figure 5A:
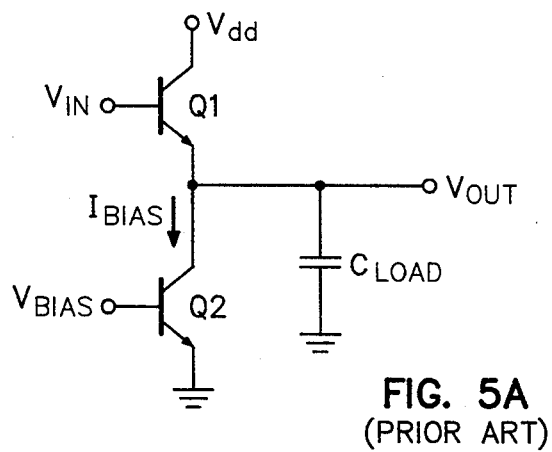
FIGS. 5A–5C show a dual-transistor NPN emitter-follower amplifier with associated input and output waveforms from the prior art.
Figure 5B:
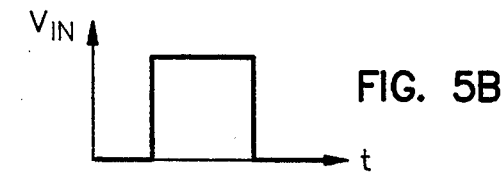
Figure 5C:
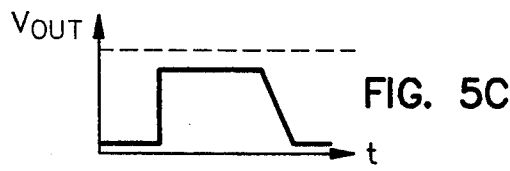
Figure 6A:
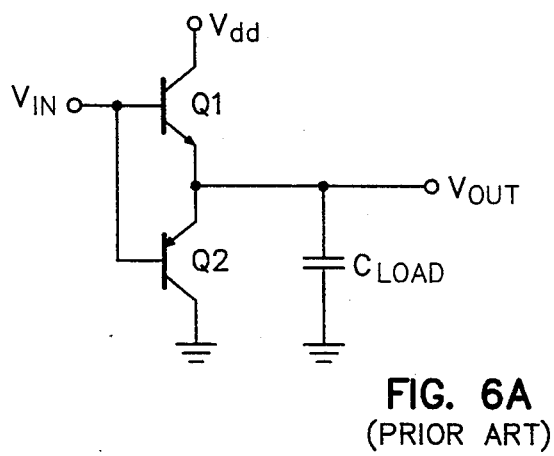
FIGS. 6A–6C show a dual-transistor complementary emitter-follower amplifier with associated input and output waveforms from the prior art.
Figure 6B:
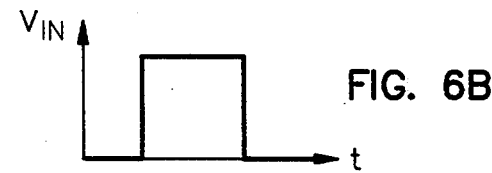
Figure 6C:
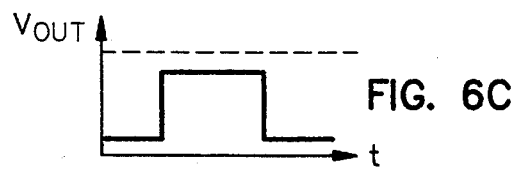
Figure 7A:
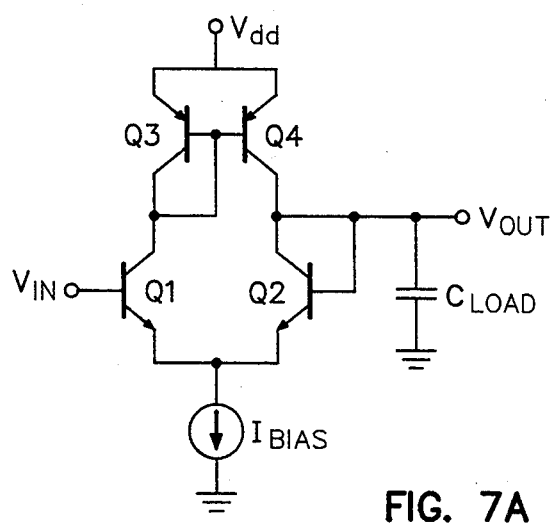
FIGS. 7A–7C show a typical differential amplifier capacitor-charging circuit with associated input and output waveforms from the prior art.
Figure 7B:
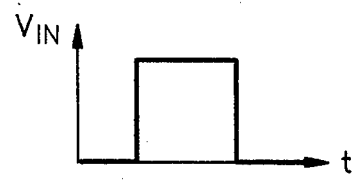
Figure 7C:
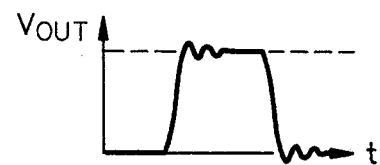

Although the impedance buffer circuit of FIG. 8A solves the rise time delay and voltage offset problems of the circuits in FIGS. 6A and 7A, the waveform in FIG. 8C suffers from a delayed falling edge. This is because the single-transistor version of emitter-follower amplifier 22 in FIG. 8A provides no assistance to differential amplifier 20 in pulling down the value of $V_{OUT}$ at the end of the impulse wave. This problem can be resolved through the addition of a complementary BJT Q6 such as shown in FIG. 9A.

Figure 9A:
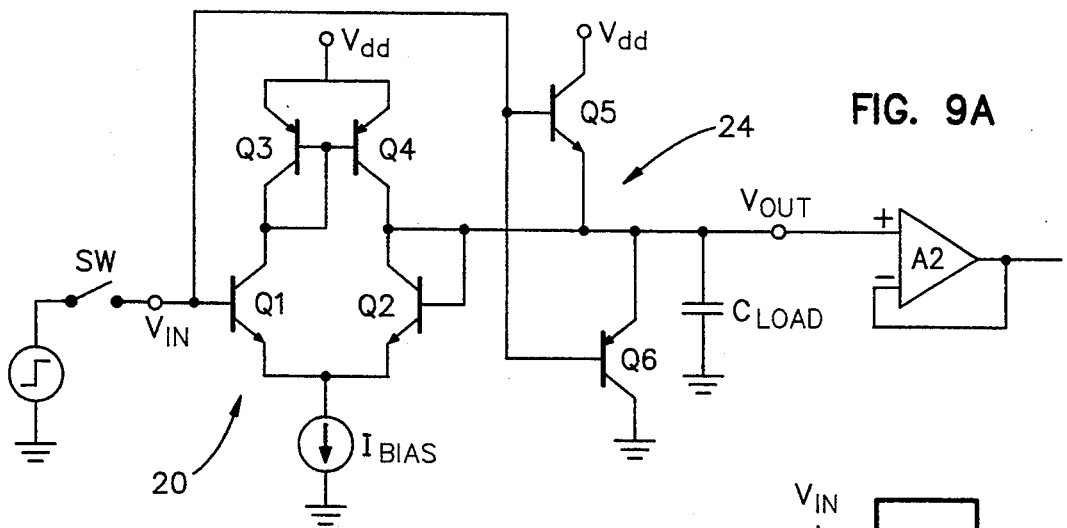
FIGS. 9A–9D show an alternative embodiment of the impedance buffer circuit of this invention embodied in a sample-and-hold circuit with associated input and output waveforms.
Figure 9B:
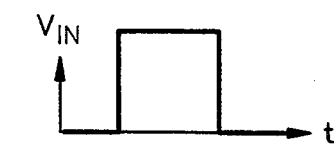
Figure 9C:
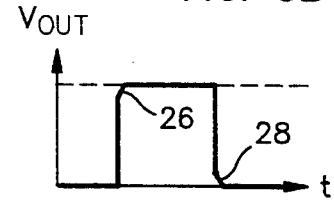
Figure 9D:
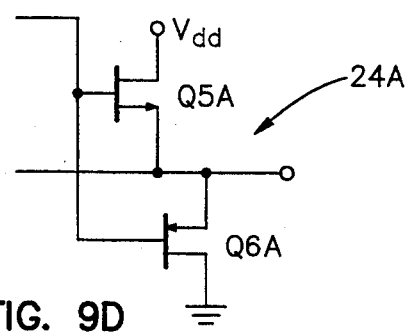

In the sample and hold circuit shown in FIG. 9A, differential amplifier 20 is connected in parallel with a complementary emitter-follower amplifier 24 to form an impedance buffer between the sampling gate SW producing input voltage $V_{IN}$ and the opamp A2 at the output of the charge storage capacitor $C_{LOAD}$. Emitter-follower amplifier 24 includes the two BJTs Q5 and Q6 connected in the complementary manner well-known in the art for such emitter-follower amplifiers. The BJT Q6 rapidly pulls the output voltage $V_{OUT}$ down at the end of the input pulse as shown by the waveform in FIG. 9C. Again, as $V_{OUT}$ approaches $V_{be}$ for BJT Q6, transistor Q6 is cut off and differential amplifier 20 then completes the reduction of $V_{OUT}$ to zero at the slower rate. The output pulse in FIG. 9C shows the slower but more precise operation of differential amplifier 20 at the two corners 26 and 28. Advantageously, emitter follower amplifier 24 in FIG. 9A bay also be embodied as a pair of unipolar transistors Q5A and Q6A substantially as shown in the emitter follower amplifier 24A in FIG. 9D, which is also known in the art as a "drain-follower".

The impedance buffer of this invention shown in FIG. 9A is also suitable for Three Input AMPlifiers (TIAMPs). TIAMPs can be understood with reference to the journal article by C. P. Chong, et.al. ("Using Active Components to Perform Voltage Division in Digital-to-Analog Conversion", IEEE Journal of Solid State Circuits, Vol. 24, pp. 999–1002, August 1989). Chong et.al. teach the use of the TIAMP for digital-to-analog conversion and related applications. The advantage offered by the TIAMP is the increased speed arising from automatic binary voltage division at each stage. The TIAMP has two channels, which are ideally perfectly matched. If the gain of each of the two channels is identical, the TIAMP acts as a voltage summer with a gain of one-half or, alternatively, as a voltage averager, provided that the TIAMP is connected in a closed-loop configuration. Significantly, the TIAMP in closed-loop configuration extends the closed-loop bandwidth beyond the open-loop unity-gain bandwidth.

Figure 10:
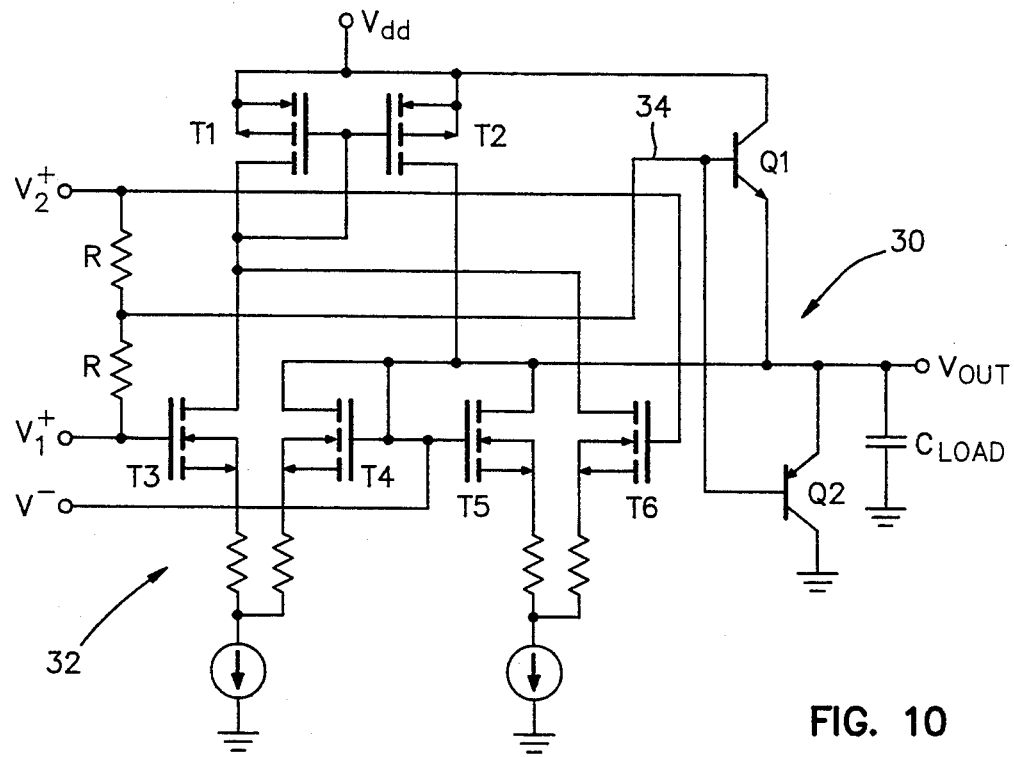
FIG. 10 shows a three-input embodiment of the impedance buffer circuit of this invention.

FIG. 10 shows an exemplary monolithic impedance-buffer circuit implemented using a three-input differential amplifier (TIAMP) connected in parallel with a complementary emitter-follower amplifier. Emitter-follower amplifier 30 is made up of the two BJTs Q1 and Q2. TIAMP 32 is made up of the six unipolar transistors T1–T6, which include the two P-channel MOSFETs T1 and T2 and the four N-channel MOSFETs T3–T6.

The two differential inputs to TIAMP 32 are shown as the input pair $V_1+$, $V^-$ and $V_2+$, $V^-$. Complementary emitter-follower amplifier 30 has an input line 34 that is connected to a voltage divider network consisting of the two resistors R. This connection ensures that input line 34 is held to the average value of the two differential input signals. Because TIAMP 32 also is an averaging amplifier, the output voltage $V_{OUT}$ on the load capacitor $C_{LOAD}$ is raised to the average of the two input signals by either emitter-follower 30 or TIAMP 32. With this arrangement, the combination of both amplifiers 30 and 32 operates as a "three-input" impedance buffer circuit with an output waveform similar to that illustrated in FIG. 9C.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawing.

We claim:

1. An impedance buffer circuit having an input voltage signal and an output voltage signal, said circuit comprising:
   input means for accepting said input voltage signal;
   output means for producing said output voltage signal;
   differential amplifier means having a first analog input coupled to said input means and a second analog input coupled to said output means for maintaining said output voltage signal in a predetermined equilibrium with said input voltage signal; and
   emitter-follower means having an emitter-follower input coupled to said input means and an emitter-follower output coupled to said output means for supplying to said output means an output current corresponding to the ratio of said input voltage signal to said output voltage signal.

2. The impedance buffer circuit of claim 1 wherein said emitter-follower means comprises:
   a NPN Bipolar Junction Transistor (BJT) having a base coupled to said input means and an emitter coupled to said output means.

3. The impedance buffer circuit of claim 2 wherein said emitter-follower means further comprises:
   a PNP BJT having a base coupled to said input means and an emitter coupled to said output means.

4. The impedance buffer circuit of claim 3 wherein said differential amplifier means comprises:
   first and second NPN BJTs with commonly-coupled emitters wherein the base of said first NPN BJT is coupled to said input means and the collector and base of said second NPN BJT are coupled to said output means.

5. The impedance buffer circuit of claim 4 wherein said differential amplifier means further comprises:
   first and second PNP BJTs with commonly-coupled emitters whose bases are coupled to the collector of said first PNP BJT and to the collector of said first NPN BJT, wherein the collector of said second PNP BJT is coupled to said output means.

6. The impedance buffer circuit of claim 5 wherein said impedance buffer circuit is implemented in a monolithic integrated circuit (IC).

7. The impedance buffer circuit of claim 1 wherein said differential amplifier means comprises:
   first and second NPN BJTs with commonly-coupled emitters wherein the base of said first NPN BJT is coupled to said input means and the collector and base of said second NPN BJT are coupled to said output means.

8. The impedance buffer circuit of claim 7 wherein said differential amplifier means further comprises:
first and second PNP BJTs with commonly-coupled emitters whose bases are coupled to the collector of said first PNP BJT and to the collector of said first NPN BJT, wherein the collector of said second PNP BJT is coupled to said output means.

9. The impedance buffer circuit of claim 1 wherein said emitter-follower means comprises:
a P-channel Field-Effect Transistor (PFET) having a gate coupled to said input means and a source coupled to said output means.

10. The impedance buffer circuit of claim 9 wherein said emitter-follower means further comprises:
a N-channel FET (NFET) having a gate coupled to said input means and a source coupled to said output means.

11. The impedance buffer circuit of claim 1 wherein said impedance buffer circuit is implemented in a monolithic IC.

12. A sample-and-hold circuit comprising:
charge storage means;
input means for accepting an analog signal having a voltage level and producing a sample voltage signal substantially representative of said analog signal voltage level;
opamp means having an output and an input coupled to said charge storage means for producing at said opamp means output an output sample signal;
sampling gate means coupled to said input means for selecting a sampling time interval during which said sample voltage signal is connected to said charge storage means; and
impedance buffer means coupled between said sampling gate means and said charge storage means for supplying the charging current necessary to reproduce said sample voltage signal as an output sample voltage signal at said charge storage means, wherein said impedance buffer means includes a differential amplifier circuit having an input and an output and an emitter-follower amplifier circuit having an input and an output connected in parallel with the input and output of said differential amplifier circuit.

13. The sample-and-hold circuit of claim 172 wherein said impedance buffer means comprises:
buffer input means for accepting said sample voltage signal;
buffer output means for producing said output sample voltage signal;
differential amplifier means having a first analog input coupled to said buffer input means and a second analog input coupled to said buffer output means for maintaining said output sample voltage signal in a predetermined equilibrium with said sample voltage signal; and
emitter-follower means having an emitter-follower input coupled to said buffer input means and an emitter-follower output coupled to said buffer output means for supplying to said buffer output means an output current corresponding to the ratio of said sample voltage signal to said output sample voltage signal.

14. The sample-and-hold circuit of claim 13 wherein said emitter-follower means comprises:

a NPN BJT having a base coupled to said buffer input means and an emitter coupled to said buffer output means: and
a PNP BJT having a base coupled to said buffer input means and an emitter coupled to said buffer output means.

15. The sample-and-hold circuit of claim 14 wherein said differential amplifier means comprises:
first and second NPN BJTs with commonly-coupled emitters wherein the base of said first NPN BJT is coupled to said buffer input means and the collector and base of said second NPN BJT are coupled to said buffer output means; and
first and second PNP BJTs with commonly-coupled emitters whose bases are coupled to the collector of said first PNP BJT and to the collector of said first NPN BJT, wherein the collector of said second PNP BJT is coupled to said buffer output means.

16. The sample-and-hold circuit of claim 15 wherein said input buffer circuit is implemented in a monolithic IC.

17. The sample-and-hold circuit of claim 13 wherein said differential amplifier means comprises:
first and second NPN BJTs with commonly-coupled emitters wherein the base of said first NPN BJT is coupled to said buffer input means and the collector and base of said second NPN BJT are coupled to said buffer output means; and
first and second PNP BJTs with commonly-coupled emitters whose bases are coupled to the collector of said first PNP BJT and to the collector of said first NPN BJT, wherein the collector of said second PNP BJT is coupled to said buffer output means.

18. The sample-and-hold circuit of claim 12 wherein said input buffer circuit is implemented in a monolithic IC.

19. A three-input impedance buffer circuit having two input voltage signals and an output voltage signal, said circuit comprising:
first and second input means for accepting said two input voltage signals;
output means for producing said output voltage signal;
three-input amplifier (TIAMP) means having a first TIAMP input coupled to said first input means, a second TIAMP input coupled to said second input means and a third TIAMP input and a TIAMP output coupled to said output means for maintaining said output voltage signal in predetermined equilibrium with said two input voltage signals; and
emitter-follower means having an emitter-follower input coupled to said first and second input means and an emitter-follower output coupled to said output means for supplying to said output means an output current corresponding to the ratios of said two input voltage signals to said output voltage signal.

20. The three-input impedance buffer circuit of claim 19 wherein said emitter-follower means comprises:
a NPN BJT having a base coupled to said first and second input means and an emitter coupled to said output means.

21. The three-input impedance buffer circuit of claim 20 wherein said emitter-follower means further comprises:

a PNP BJT having a base coupled to said first and second input means and an emitter coupled to said output means.

22. The three-input impedance buffer circuit of claim 21 wherein said TIAMP means comprises:

first and second N-channel Metal-Oxide-Semiconductor (NMOS) FETs with commonly-coupled sources wherein the gate of said first NMOSFET is coupled to said first input means and the drain and gate of said second NMOSFET are coupled to said output means; and third and fourth NMOSFETs with commonly-coupled sources wherein the gate of said third NMOSFET is coupled to said second input means and the drain and gate of said fourth NMOSFET are coupled to said output means.

23. The three-input impedance buffer circuit of claim 22 wherein said TIAMP means further comprises:

first and second P-channel MOSFETs (PMOSFETs) with commonly-coupled sources whose gates are coupled to the drain of said first PMOSFET and to the drains of said first and third NMOSFETs wherein the drain of said second PMOSFET is coupled to said output means.

24. The three-input impedance buffer circuit of claim 19 wherein said TIAMP means comprises:

first and second NMOSFETs with commonly-coupled sources wherein the gate of said first NMOSFET is coupled to said first input means and the drain and gate of said second NMOSFET are coupled to said output means; and third and fourth NMOSFETs with commonly-coupled sources wherein the gate of said third NMOSFET is coupled to said second input means and the drain and gate of said fourth NMOSFET are coupled to said output means.

25. The three-input impedance buffer circuit of claim 24 wherein said TIAMP means further comprises:

first and second P-channel PMOSFETs with commonly-coupled sources whose gates are coupled to the drain of said first PMOSFET and to the drains of said first and third NMOS FETs wherein the drain of said second PMOSFET is coupled to said output means.

26. The three-input impedance buffer circuit of claim 25 wherein said three-input impedance buffer circuit is implemented in a monolithic IC.

27. The three-input impedance buffer circuit of claim 19 wherein said three-input impedance buffer circuit is implemented in a monolithic IC.

* * * * *